United States Patent [19]

Mecklenburg

[11] 4,263,653
[45] Apr. 21, 1981

[54] DIGITAL RF WATTMETER

[75] Inventor: Frank H. Mecklenburg, Russell, Ohio

[73] Assignee: Bird Electronic Corporation, Solon, Ohio

[21] Appl. No.: 45,329

[22] Filed: Jun. 4, 1979

[51] Int. Cl.³ .................... G01R 27/06; G01R 21/00
[52] U.S. Cl. .................................. 364/483; 324/58 B; 324/95
[58] Field of Search ............ 364/481, 483; 324/58 A, 324/58 B, 58 R, 95; 325/67, 133, 363; 445/115, 226, 67

[56] References Cited

U.S. PATENT DOCUMENTS

| | | | |
|---|---|---|---|
| 3,796,948 | 3/1974 | Wentworth | 324/58 B |
| 3,835,379 | 10/1974 | Templin | 324/58 B |
| 4,041,395 | 8/1977 | Hill | 324/58 B |
| 4,048,564 | 9/1977 | Gleeson, Jr. | 325/133 |
| 4,070,619 | 1/1978 | Trefney | 324/58 B |
| 4,075,554 | 2/1978 | Mecklenburg | 324/58 B |
| 4,110,685 | 8/1978 | Leenerts | 324/58 B |

Primary Examiner—Charles E. Atkinson
Assistant Examiner—Gary Chin
Attorney, Agent, or Firm—Pearne, Gordon, Sessions, McCoy & Granger

[57] ABSTRACT

An electronic instrument is disclosed for measuring directional RF power levels and power function levels on a coaxial transmission line. The instrument includes an inductive sensing loop for sensing the RF voltage level on the transmission line and producing a voltage level proportional thereto. An analog-to-digital conversion means is connected to the sensing loop for converting the voltage level from the sensing loop to binary voltage data. A microcomputer means is associated with the conversion means for performing arithmetic operations upon the binary voltage data to calculate power data and power function data. Means connected to the microcomputer means are also provided for displaying the calculated power data and power function data. The instrument provides a direct readout in digital form of RF power data and data for various power and voltage functions such as VSWR.

22 Claims, 12 Drawing Figures

SWITCH SETTINGS PERFORMED AT STEPS 125 AND 127

| FUNCTION | V₁ | SWITCHES 55 56 57 58 59 60 | V₂ | SWITCHES 55 56 57 58 59 60 |
|---|---|---|---|---|
| FWD CW | $V_{FPE}$ | X O X X O O | $V_{FVE}$ | X O X O X O |
| RFL CW | $V_{RPE}$ | O X X X O O | $V_{RVE}$ | O X X O X O |
| VSWR | $V_{FDC}$ | X O O O O X | $V_{RDC}$ | O X O O O X |
| FWD PEP | $V_{FPE}$ | X O X X O O | $V_{FPE}$ | X O X X O O |
| RFL PEP | $V_{RPE}$ | O X X X O O | $V_{RPE}$ | O X X X O O |
| % MOD | $V_{FPE}$ | X O X X O O | $V_{FVE}$ | X O X O X O |
| FWD dBm | $V_{FPE}$ | X O X X O O | $V_{FVE}$ | X O X O X O |
| RFL dBm | $V_{RPE}$ | O X X X O O | $V_{RVE}$ | O X X O X O |
| RTN LOSS | $V_{FDC}$ | X O O O O X | $V_{RDC}$ | O X O O O X |
| D.C. OFFSET | $V_0$ | O O O O O X | | |

X = SWITCH CLOSED    O = SWITCH OPEN

Fig. 11

ARITHMETIC OPERATIONS PERFORMED AT STEP 133

$$\text{FWD CW} = \left[(\sqrt{P_{FPE}} + \sqrt{P_{FVE}})/2\right]^2$$

$$\text{RFL CW} = \left[(\sqrt{P_{RPE}} + \sqrt{P_{RVE}})/2\right]^2$$

$$\text{VSWR} = \left[(\sqrt{P_{FDC}} + \sqrt{P_{RDC}})/(\sqrt{P_{FDC}} - \sqrt{P_{RDC}})\right]$$

$$\text{FWD PEP} = \left[(\sqrt{P_{FPE}} + \sqrt{P_{FPE}})/2\right]^2$$

$$\text{RFL PEP} = \left[(\sqrt{P_{RPE}} + \sqrt{P_{RPE}})/2\right]^2$$

$$\text{\% MOD} = \left[(\sqrt{P_{FPE}} - \sqrt{P_{FVE}})/(\sqrt{P_{FPE}} + \sqrt{P_{FVE}})\right] \times 100$$

$$\text{FWD dBm} = 10 \log \left[(\sqrt{P_{FPE}} + \sqrt{P_{FPE}})/2\right]^2$$

$$\text{RFL dBm} = 10 \log \left[(\sqrt{P_{RPE}} + \sqrt{P_{RVE}})/2\right]^2$$

$$\text{RTN LOSS} = 10 \log (\sqrt{P_{FDC}}/\sqrt{P_{RDC}})^2$$

Fig. 12

DIGITAL RF WATTMETER

BACKGROUND OF THE INVENTION

1. Field of the Invention

This invention relates to electronic instruments for detecting and measuring RF voltage wave signals on coaxial transmission lines, such as between a transmitting antenna and a transmitter. More particularly, the invention relates to an "insertion-type" RF directional wattmeter for detecting and measuring both the forward and reflected voltage wave signals on a coaxial transmission line.

2. Description of the Prior Art

Insertion-type RF directional wattmeters are used in many applications in the RF field, particularly in matching antennas to coaxial transmission lines and in minimizing the voltage standing wave ratio (VSWR) on coaxial lines. Meters currently available for this application are, for example, of the type disclosed in U.S. Pat. Nos. 2,852,741; 2,891,221; 4,080,566 and 4,075,554.

In these units, a rigid, coaxial line section is inserted in the coaxial transmission line, such as by standard coaxial connectors, and an inductive pickup coil is positioned in a transverse opening in the outer conductor of the line section. This pickup coil is adapted for rotation about an axis normal to the axis of the line section and is connected by special leads to a D'Arsonval meter movement. The resulting meter reading indicates the magnitude of the wave signal in watts, the indication being either that of the magnitude of the forward voltage wave level or the reflected voltage wave level, depending upon the particular orientation of the pickup coil.

The pickup coil is located in the electrical field between the inner and outer conductors of a coaxial transmission line and has a voltage induced therein proportional to the current I in the inner conductor, there being a mutual inductance M between the loop and the transmission line and the loop being positioned in the plane of the inner conductor of the line. A series circuit of resistance R and capacitance C connected across the transmission line conductors will give a voltage across the resistance R proportional to the voltage V between the line conductors. In directional couplers and so-called reflectometers, these arrangements are combined in a sampling circuit in which the resistor R is connected in series with the loop, and capacitive coupling is provided as by capacitive plates or windings on the loop and the inner conductor or by capacitive effects between the components of the sampling circuit and the inner conductor.

Considering this sampling circuit and using lumped impedances, it is apparent that the mutual inductance M is either positive or negative, depending upon the directional relation between the loop and the wave signal energy traveling on the line.

The instrument described obtains reversal of the mutual inductance M through 180° rotation of the loop relative to the transmission line. The forward traveling wave has voltage $V_F$ and current $I_F$, while the reflected traveling wave has voltage $V_R$ and current $I_R$. Thus, if $Z_o$ is the characteristic impedance of the line, and p is the reflection coefficient, $$p = \frac{V_R}{V_F} = -\frac{I_R}{I_F}$$

and $$e = jw(RCV + MI)$$
$$= jwV[RC(1 + p) + (M/Z_o)(1 - p)]$$

where e is the total electromotive force induced in the loop or sampling circuit. The components are selected so that $$RC = M/Z_o = K$$

K being a constant. If $e^+$ is the electromotive force when M is positive, so that the voltage across R and the voltage induced in the loop are additive, and $e^-$ is the electromotive force when M is negative and the voltages referred to are opposed, the former gives a maximum and the latter a minimum indication, thus:

$$e^+ = jwV_F[K(1 + p) + K(1 - p)]$$
$$= 2jwK(V_F)$$

$$e^- = jwV[K(1 + p) - K(1 - p)]$$
$$= 2jwK(V_Fp)$$
$$= 2jwK(V_R)$$

Thus the RF output voltage in the loop is directional and proportional to the voltage in the line due to either the forward or reflective wave, and from the loop voltage, measurements of the reflection coefficient and voltage standing wave ratio can be obtained.

It is also possible to measure the forward power $P_F$ and the reflected power $P_R$ being fed through the transmission line $$P_F = V_F I \cos\theta = V_F \cdot I$$
$$= V_F \frac{V_F}{Z_o}$$
$$= \frac{V_F^2}{Z_o} = \frac{(e^+)^2}{4w^2K^2Z_o}$$

and $$P_R = \frac{(e^-)^2}{4w^2K^2Z_o}$$

so that $$e^+ = 2wK\sqrt{Z_o}(\sqrt{P_F})$$

$$e^- = 2wK\sqrt{Z_o}(\sqrt{P_R})$$

The prior art instruments utilizing the principles referred to above generally included a coil physically inserted in a line section of suitable size with the coil rotatable through 180° of travel in the field between the outer conductor and inner conductor of the line section in order to sense the magnitude of either the forward voltage wave level or the reflected voltage wave level. The coil was then connected to a conventional analog meter movement with the meter calibrated in watts to give a visual power indication representative of either the forward or reflective voltage wave signals on the transmission line. In addition, such meters may have included circuit means for sensing the peak voltage level on the line and displaying this peak pulse or envelope power reading in addition to an average carrier wave (CW) reading.

While the intruments of the prior art were suitable for reading peak and CW power, additional external computations or calculations were often required to measure useful functions such as the voltage standing wave ratio, percent modulation, decibels and other functions. For example, if the voltage standing wave ratio (VSWR) were desired, it would sometimes be necessary with the instruments of the prior art to take forward power and reverse power readings and use computations to arrive at a value for the voltage standing wave ratio or to plot each of these readings on a nomograph to arrive at the VSWR value. Alternatively, it was required to adjust calibration potentiometers within the instrument to permit VSWR to be read directly from the analog meter.

SUMMARY OF THE INVENTION

The present invention provides unique advantages over the prior art instruments which allow the user to directly read in digital form readings for the forward and reverse power in watts, the peak envelope power, and additional functions, such as VSWR, which were unavailable with the wattmeters of the prior art without complicated adjustments. In addition, the instrument of the present invention may include additional circuitry to sense increases or decreases in the power readings and to display visual indications of such increases or decreases and to provide an indication of the amount of these increases or decreases.

Another advantage of the instrument of the present invention is that it provides a highly accurate means for converting the measured voltage readings to power readings, which includes linear interpolation to convert the voltage value to the square root of the power value, and which includes the use of values of the square root of peak envelope power and the square root of valley envelope power to calculate the carrier wave (CW) power. Using the voltage-to-power conversion method of the present invention, diode thresholds do not cause error as they do in the prior art when a detector output is DC averaged to arrive at CW power. This error is avoided because the diode threshold is taken into account in the linear interpolation before the values are averaged.

By displaying a visual indication of the changes in the power readings, the present invention allows the operator to adjust the signals to local minimums and maximums without requiring the operator to read the displayed digital values, which would be changing at a rate of three times per second.

The instrument of the present invention combines the advantages of high accuracy with ease of operation. The instrument is as accurate as the analog wattmeters of the prior art, and it is easier to use because of its digital display, which is easier to read than an analog meter reading. The instrument is also highly dependable, due to the inherent nature of solid state components, which are far less likely to fail than the mechanical components used in the prior art analog instruments. Moreover, the instrument is highly rugged and is highly portable, weighing only about four pounds, so that it may be used almost anywhere. In addition, the instrument has capabilities far beyond those of any single wattmeter of the prior art, yet it is less expensive to manufacture, due to the decreasing cost of most solid state components.

The instrument of the present invention, which is adapted to measure RF power levels and power function levels on a coaxial transmission line, is inserted into the line and comprises an inductive sensing loop for sensing the RF voltage level on the transmission line and producing a voltage level proportional thereto. Connected to the sensing loop is an analog-to-digital conversion means for converting the voltage level from the sensing loop into binary voltage data. A microcomputer means is associated with the conversion means for performing arithmetic operations upon the binary voltage data to calculate power data and power function data. The instrument also includes means connected to the microcomputer means for displaying the power data and power function data calculated by the microcomputer means.

Preferably, the instrument also comprises a second inductive sensing loop for sensing RF voltage in the other direction in the transmission line and producing a second voltage level proportional thereto. In addition, means connected to the sensing loop or loops may be provided for detecting the peak envelope voltage wave level on the transmission line and/or the valley envelope voltage wave level on the transmission line.

The microcomputer means preferably includes means for converting the binary voltage data to binary data representing the square root of power. The microcomputer means also preferably includes means for calculating functions such as voltage standing wave ratio, percent modulation, return loss, and decibels.

In addition, the instrument may include means within the microcomputer means for converting the binary voltage data to binary data representing the square root of power for use in calculating the power data and power function data. The microcomputer means may also include means for comparing the calculated value for the power data and power function data with a previously calculated data value to obtain a parameter representing a change in the calculated value over the previous value. The microcomputer means may also include means for comparing each calculated value of the power data and power function data with the maximum previously calculated value to obtain a new maximum value which is supplied to the display means.

BRIEF DESCRIPTION OF THE DRAWINGS

FIG. 11 is a table showing the position of the various analog switches of the instrument dependent upon the function which the instrument is calculating.

FIG. 12 is a table showing the calculations performed on values of the square root of power to obtain the various power function values.

DETAILED DESCRIPTION OF THE PREFERRED EMBODIMENT

Figure 1:
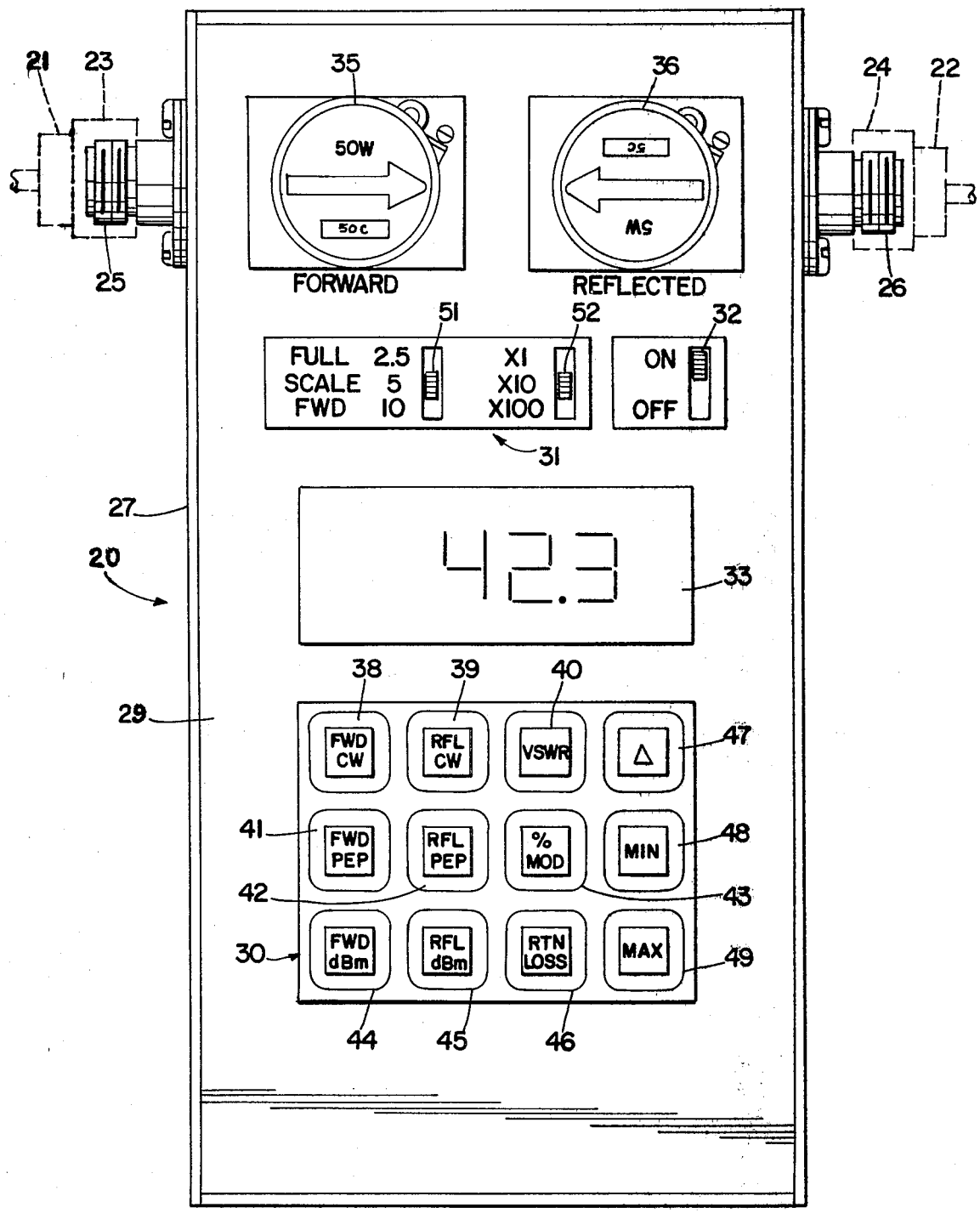
FIG. 1 is an elevational view showing the instrument of the present invention and, in particular, showing the front exterior case of the instrument.

Referring more particularly to the drawings, FIG. 1 shows a radio frequency (RF) digital wattmeter instrument 20 typical of the type of the present invention, and adapted for detecting and measuring the forward and reflected RF voltage wave levels on an RF coaxial transmission line. The instrument 20 is inserted between ends 21 and 22 of the coaxial cable which have standard male coaxial connectors 23 and 24, shown in broken lines in FIG. 1, for connection to the corresponding female connectors 25 and 26 of the instrument. The instrument 20 preferably has a metal base that supports the various electrical components and an outer housing 27 secured to the base and formed of conductive material.

The housing 27 supports the front panel 29 upon which are mounted the various input controls and output readouts. The input controls comprise a keyboard 30, a pair of range switches 31 and an on-off switch 32. The keyboard 30 comprises a plurality of keys through which the user controls the power functions to be measured, calculated and displayed. The resulting function values are displayed on an LED display 33, which preferably comprises four seven-segment LED display digits with a floating decimal point.

The instrument 20 also includes two directional plug-in detector elements 35 and 36. The plug-in elements 35 and 36 are self-contained, directional detectors calibrated for direct indication of RF power. As shown in FIG. 1, the left-hand element 35 is normally oriented for detecting RF wave voltage in the forward direction, while the right hand element 36 is oriented for detecting reflected wave RF voltage. The directional elements are sensitive only to waves in the direction of orientation and highly insensitive or nulled to waves in the opposite direction. In most applications, a low power element will be used as the reflected element 36. The forward element 35 shown in the drawings is a 50-watt element, while the reflected element 36 shown is a 5-watt element. Elements like the elements 35 and 36 for various power ranges and frequency bans are commercially available from the Bird Electronic Corporation of Cleveland, Ohio, and these elements may be generally similar to those shown in U.S. Pat. Nos. 2,852,741 and 2,891,222.

The keyboard 30 comprises a plurality of keys 38 to 49 for input control of the desired power function to be displayed. Twelve keys are used in the preferred embodiment of the invention, but the invention is capable of having 16 keys or more. There are nine primary functions selected by the keys 38 to 46.

When the user depresses the key 38 marked "FWD CW," the instrument displays the direct digital reading of forward carrier wave power, corrected for modulation. If the carrier wave power exceeds 120% of the range of the measuring element 35, or if the peak envelope power exceeds 400% of the element range, only an overrange indication is displayed. When the key 39 marked "RFL CW" is depressed, the instrument displays the direct digital reading of reflected CW power corrected for modulation and provides similar overrange indications as for the function FWD CW based upon the range of the element 36.

The key 40 marked "VSWR" is used to select a direct digital readout of the voltage standing wave ratio to two decimal places. The range of VSWR readings is 1.00 to 99.99. VSWR values beyond this range are due to error, and are corrected by the instrument. If the forward power reading is less than 10% or greater than 120% of full scale, an underrange or overrange indication is displayed.

By depressing the key 41 marked "FWD PEP," the user selects a direct reading of the peak envelope power. An overrange indicator is displayed if the reading exceeds 120% of the range of the measuring element 35. The key 44 marked "RFL PEP" actuates the display of the reflected peak envelope power with similar overrange indications, as with FWD PEP, based upon the range of the element 36.

If the user depresses the key 43 marked "% MOD," a percent modulation value to one decimal place is displayed. The % MOD reading is limited to the range of 0.0 to 99.9% and calculated values outside of this range are set to read 0.0 or 99.9 accordingly. If the peak envelope power is less than 10% of scale, or greater than 400% of scale of the detector element, the appropriate error message will be displayed.

When the key 44, marked "FWD dBm," is depressed, the display is the number of decibels to one decimal place corrected by the range selector switches to read decibels above one milliwatt. The possible range is 0.4% to 400% of the nominal range of the measuring element 35. If the peak envelope power exceeds this range, an overrange indication is displayed. Similarly, the key 45 marked "RFL dBm" displays the number of decibels with the reading taken from the right-hand element 36.

When the user depresses the key 46 marked "RTN LOSS," the display is the return loss or the ratio of the reflected power to forward power in decibels to one decimal place. The range is 0.0 to 36.1 dB. The same underrange and overrange indications are used as those used with VSWR.

In addition to the above nine primary functions which are actuated by the keys 38 to 46, the instrument also includes three secondary functions which work simultaneously with any of the preceding nine primary functions. The secondary functions are actuated by the keys 47 to 49. All three secondary functions are cleared automatically whenever the same or a new primary function key 38 to 46 is depressed.

When the key 47 marked "Δ" is depressed, the display provides an indication of the increase or decrease in the selected primary function, in addition to displaying the primary function value. Upon actuation of the key 47, the rightmost digit of the primary function value in the display 33 is blanked and replaced by a greater-than or less-than symbol, depending upon whether the primary function value has increased or decreased since the previous reading. If there is no change, the rightmost digit is left blank. The Δ function is used in place of an analog meter for peaking.

When the key 48 marked "MIN" is held depressed, the instrument displays the lowest reading obtained since the primary function key was last pressed. Similarly, when the key 49 marked "MAX" is held depressed, the instrument displays the highest reading obtained since the primary function key was last pressed. Both MIN and MAX functions operate continuously, even when the key 48 or 49 has not been actuated, and remember the respective minimum and maximum values after each actuation of a primary function key.

The range switches 31 comprise two switches 51 and 52 which are set according to the power range of the forward detector element 35. The range switch 51 is set for a factor of the full scale of forward power is measured by the element 35, and the range switch 52 is set to add a multiplication factor of 1, 10 or 100 to the setting of the switch 51. For example, in FIG. 1, a forward detector element 35 having a full scale range of 50 watts is used. The range switch 51 is set to 5 and the switch 52 is set to "X10" since the range of the forward element is 5×10=50 watts. The range of the reflected detector element 36 is always assumed to be one-tenth of the forward element range.

The range switches 31 together provide the appropriate factors used in the calculation of the displayed output data. For power functions in which the resulting output reading is normally in units of watts, such as FWD CW, RFL CW, FWD PEP, and RFL PEP, the setting of these switches provides a multiplication constant so that the power reading corresponds to the reading measured by the detector element. For the decibel functions, FWD dBm and RFL dBm, the switch settings provide an addition constant. For the other functions which are in the form of ratios, namely, VSWR, % MOD, and RTN LOSS, the switch settings have no effect since the functions are not dependent upon the range of the elements, but only upon the ratio of the ranges between the elements 35 and 36, which ratio is always assumed to be the same.

Figure 2:
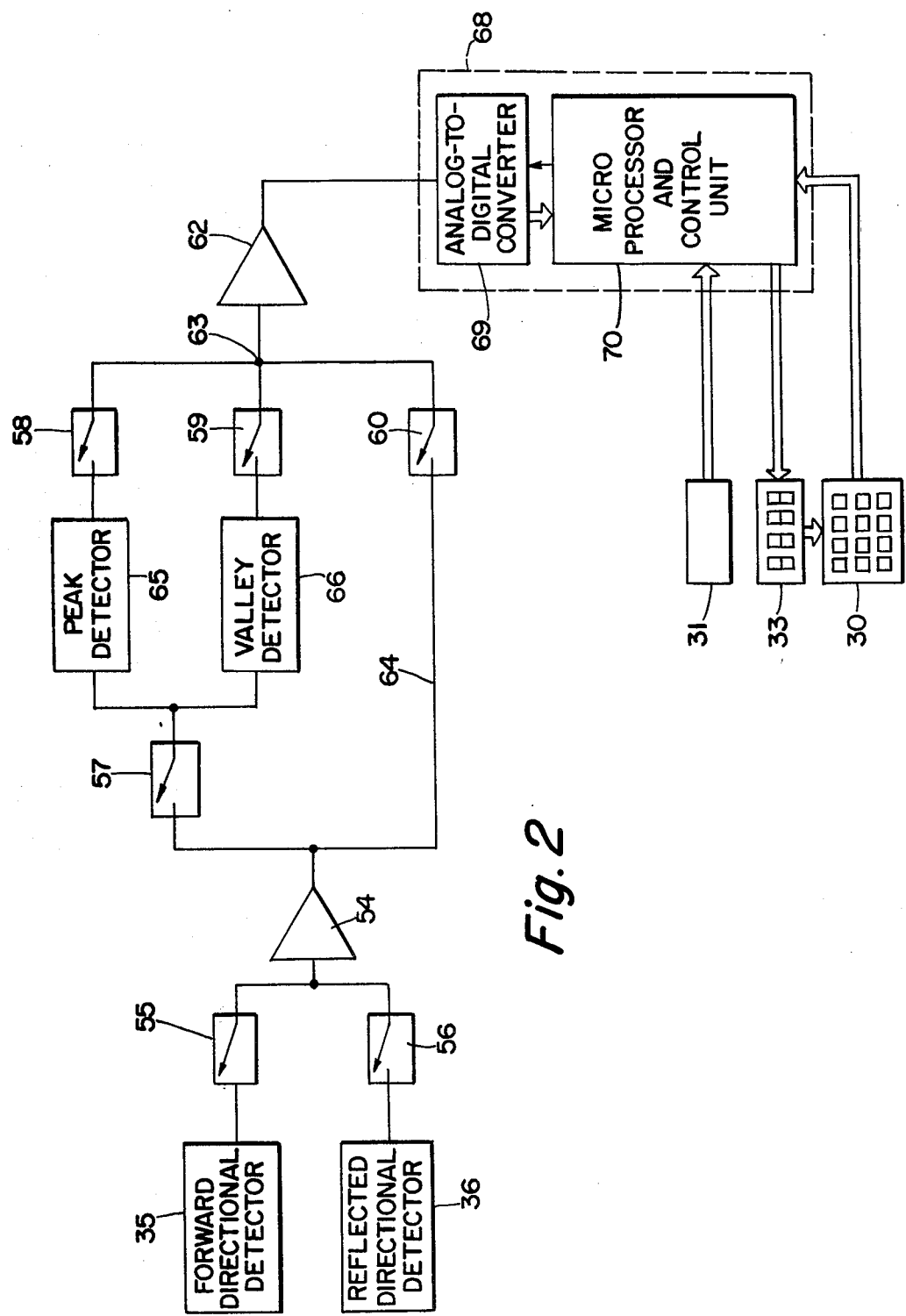
FIG. 2 is a block diagram generally indicating the major components of the instrument of the present invention.

The internal operational elements of the present invention are generally shown in FIG. 2.

The output from the forward directional detector element 35 and the reflected directional 36 are both connected to the input of a pre-amplifier 54. A switch 55 is provided on the line between the detector 35 and the pre-amplifier 54, and a switch 56 is provided on the line between the detector 36 and the pre-amplifier 54. The switches 55 and 56 are selectively actuated to permit one of the outputs of the two detector elements 35 and 36 to be fed to the input of the pre-amplifier 54.

The output of the pre-amplifier 54 is then fed to a buffer amplifier 62 through a point 63. The output of the pre-amplifier 54 is selectively connected directly to the input of the buffer amplifier 62 by a line 64 which contains a switch 60. The output from the pre-amplifier 54 is also selectively connected to either a peak envelope detector 65 or a negative peak envelope detector or valley envelope detector 66 with the output of one of the detectors 65 or 66 connected to the input of the buffer amplifier 62 through the point 63. A switch 57 is provided on the line between the output of the pre-amplifier 54 and the input of the detectors 65 and 66. A switch 58 is provided on the line between the output of the peak detector 65 and the input of the buffer amplifier 62, and a switch 59 is provided on the line between the output of the valley detector 66 and the input of the buffer amplifier 62. When the switch 60 is closed and the switch 57 is open, the output of the pre-amplifier 54 is fed directly to the input of the buffer amplifier 62 over line 64. When the switch 60 is open and the switch 57 is closed, the output of the pre-amplifier 54 is fed through either the peak detector 65 or the valley detector 66 to the buffer amplifier 62. The peak detector 65 is activated if the switch 58 is closed and the valley detector 66 is activated if the switch 59 is closed.

The selected analog output which represents either the peak or valley envelope voltage from the detector 65 or 66 or the carrier wave voltage from the line 64 is then fed from the buffer amplifier 62 to a master processing and control means 68 which includes an analog-to-digital (A-D) converter 69 and a microprocessor and control unit 70. The A-D converter 69 takes the analog voltage reading representing the selected power output from the buffer amplifier 62 and converts it to binary data. The unit 70 then performs the necessary arithmetic operations on the digital output of the A-D converter 69 to provide the desired power function in digital form. This desired power function data is then provided to the digital display 33. As the desired power function is output to the digital display 33, the unit 70 also controls a scanning of the keyboard 30, and the input function from the keyboard 30 is fed to and stored in the unit 70. Simultaneously, the setting of the range switches 31 is sensed by the unit 70. The unit 70 is connected to each of the switches 55-60, and controls the opening and closing of the switches depending upon which of the desired functions has been selected through the input of the keyboard 30.

Among the operations performed by the microprocessor and control unit 70 are comparing each calculated value with the previously calculated value, and providing, a "delta" indication, a minimum value, and a maximum value which may be output if the appropriate secondary function has been selected through the keyboard 30.

Figure 3:
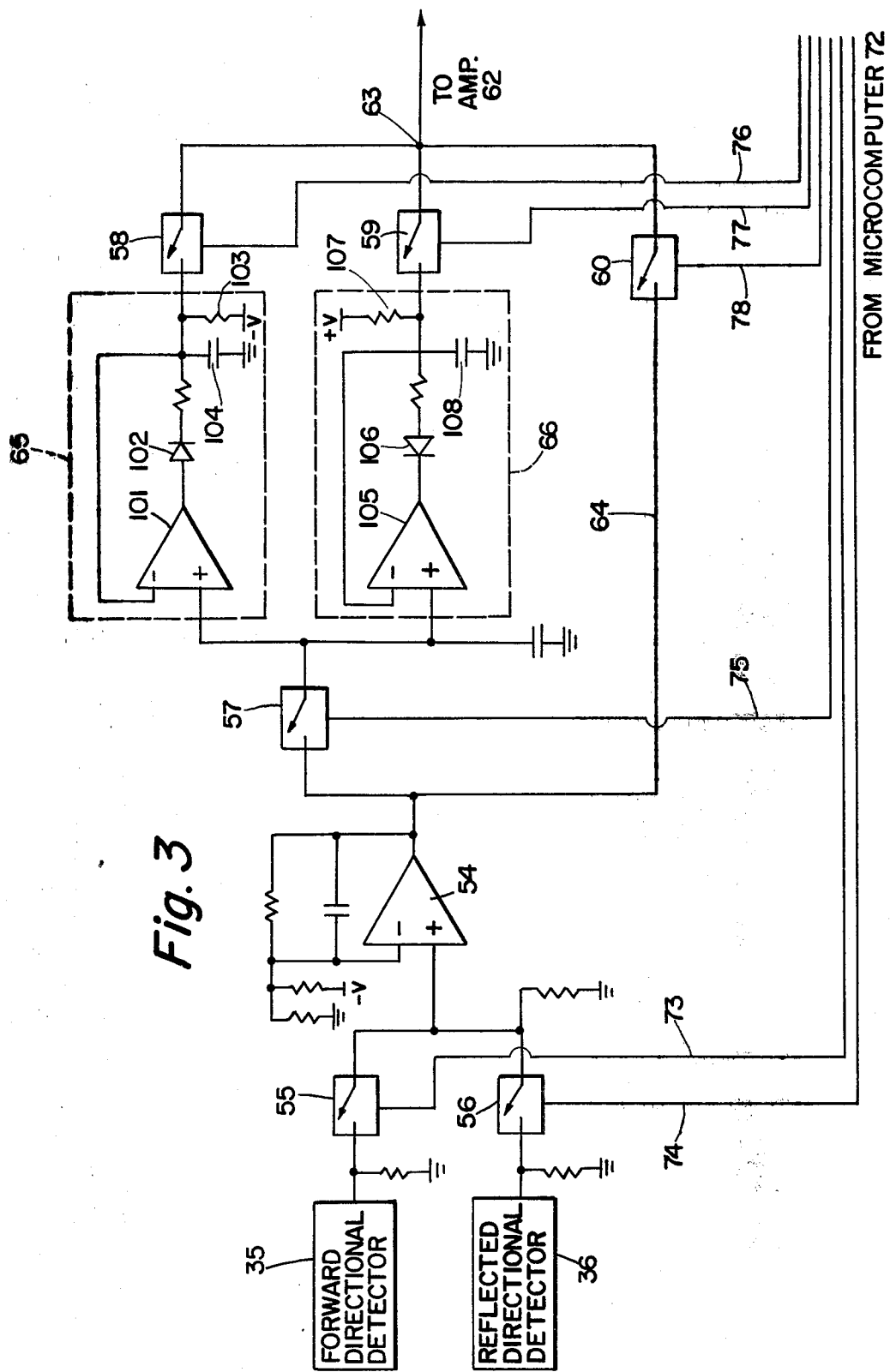
FIGS. 3, 4 and 5 are detailed circuit diagrams, each showing a portion of the components of FIG. 2.
Figure 4:
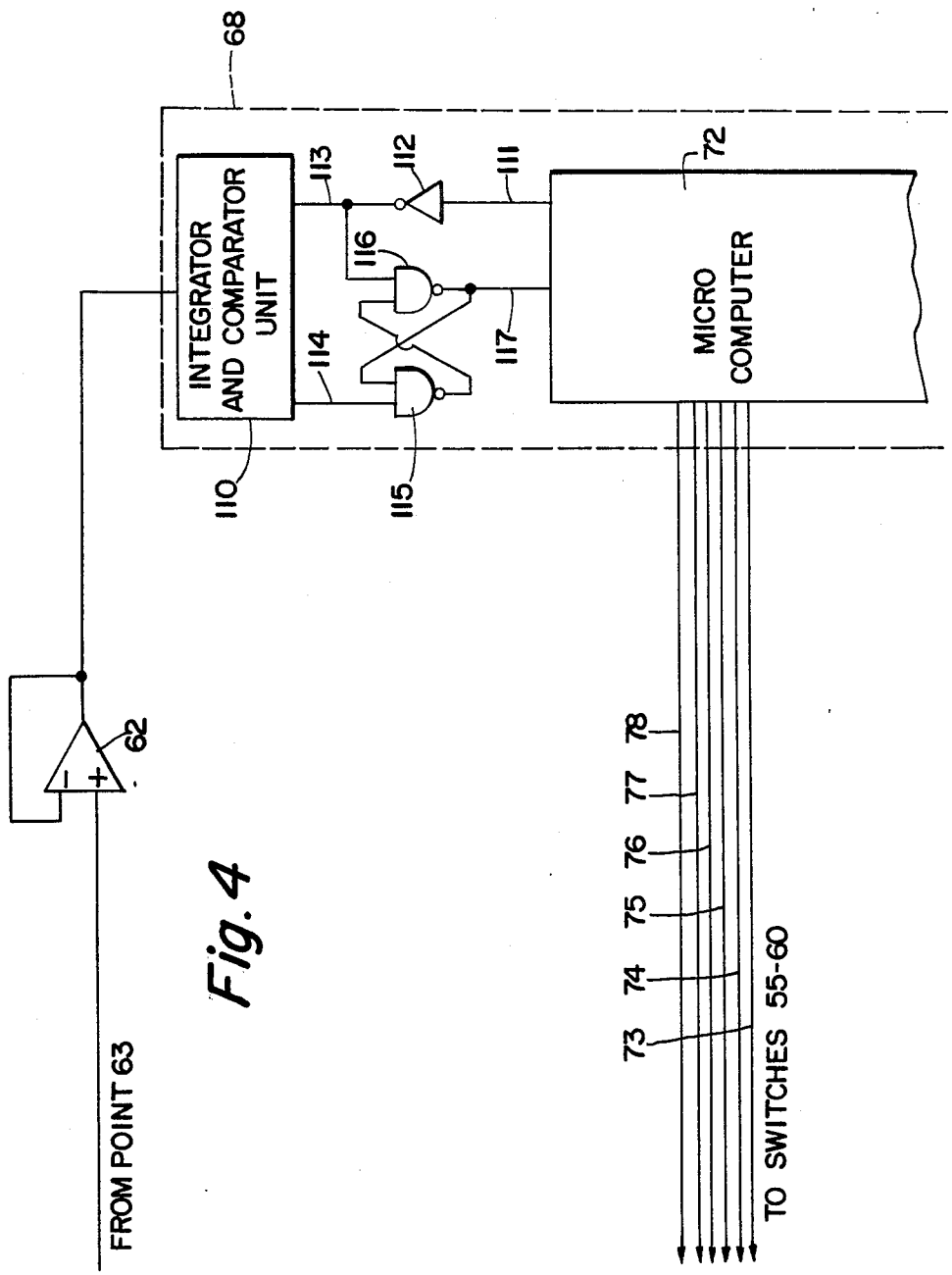
Figure 5:
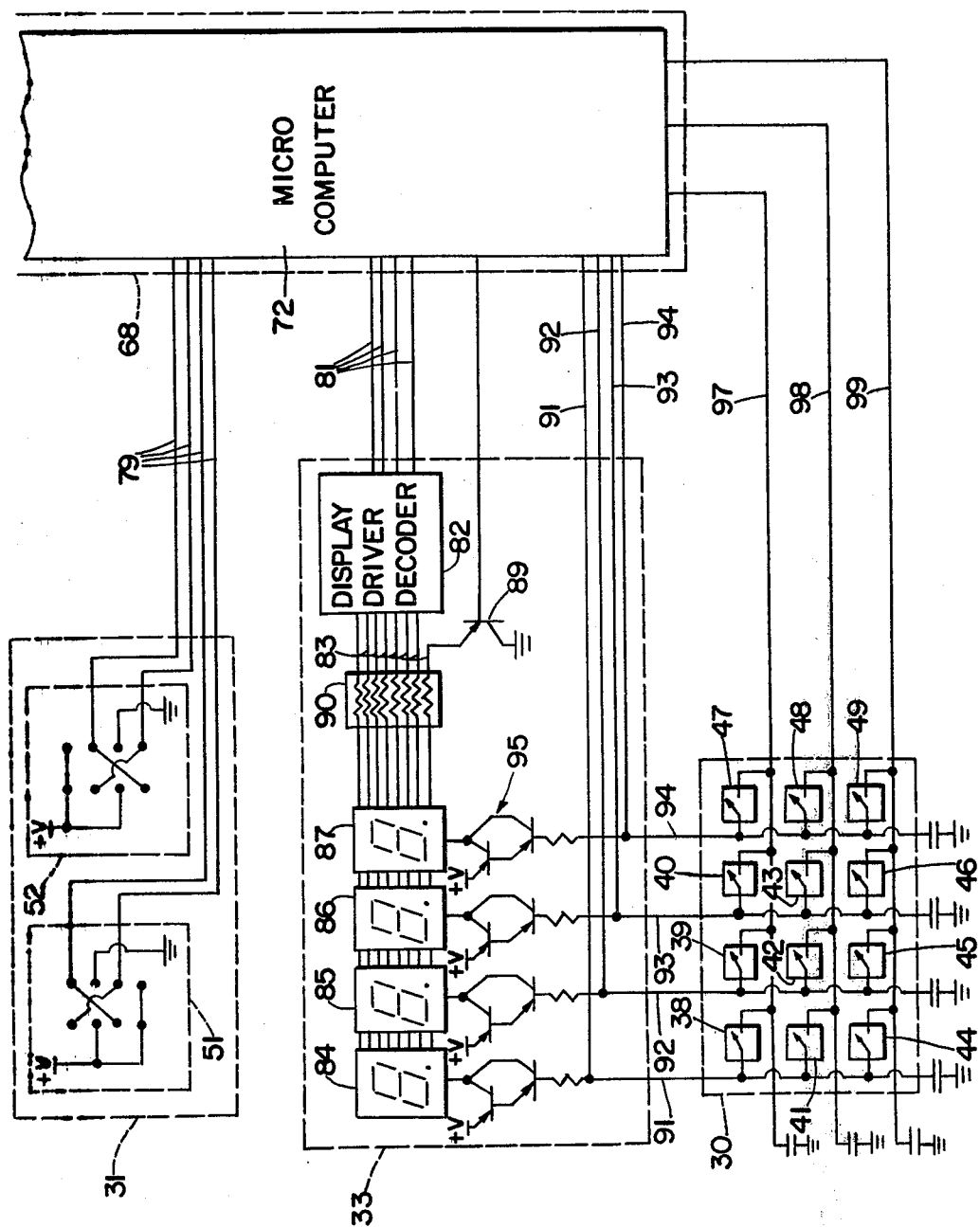

The functional elements of the instrument shown in FIG. 2 are shown in more detail in FIGS. 3, 4 and 5.

The central element of the instrument is a microcomputer 72 (FIGS. 4 and 5). The microcomputer 72 may be comprised of a single chip microcomputer, such as a R6500/1 one-chip microcomputer manufactured by Rockwell International Corporation. The microcomputer 72 comprises arithmetic and logic means, a random access memory for temporarily storing computed values, and a read-only memory containing a control program which operates all operations of the instrument. The control program will be described hereinafter in greater detail. The microcomputer 72 is connected to each of the switches 55-60 by control lines 73-78 (FIGS. 3 and 4). By means of these control lines 73-78, the microcomputer 72 controls the opening and closing of the various switches 55-60 to provide the desired analog voltage data to the buffer amplifier 62, depending upon which key of the keyboard 30 has been depressed by the user. The range switches 51 and 52 are also connected to the microcomputer 72 by lines 79 (FIG. 5). The microcomputer 72 thus senses the settings of the range switches 51 and 52 and uses these settings to correct the calculated results by the proper factor, if necessary.

The microcomputer 72 also outputs data to the display 33 and scans the keyboard 30 (FIG. 5), using known scanning techniques. The BCD digits for display are sequentially output from the microcomputer 72 on the output display lines 81 to a BCD-to-seven-segment decoder/driver 82. The decoder/driver 82, which may be a standard 7447 unit made by Texas Instruments Incorporated, converts each BCD digit received from the microcomputer 72 on the lines 81 to a seven-segment representation which is sent on the lines 83 to four LED display elements 84-87. The decimal-point information is sent from the microcomputer 72 to the display elements 84-87 on a separate line via a common collector transistor 89. A resistance element 90 may be placed in the lines 83 and 88. The appropriate display element is activated by the microcomputer 72 via scanning lines 91-94. Each scanning line 91-94 is connected to the common anode of one of the display elements 84-87. Preferably, Darlington transistors 95 are provided on each control line 91-94 to provide desired current gain for operation of the enable inputs of the display elements 84-87.

For example, when the leftmost digit is displayed, this digit in BCD form is placed on the lines 81 by the microcomputer 72, and simultaneously the microcomputer activates the scanning line 91, turning on the Darlington 95 on that line, and providing a high-level enable input to the leftmost display element 84, which then displays the digit as received in seven-segment form from the decoder/driver 82.

At the same time that the display is being output, the keyboard 30 is scanned to determine which of the keys 38-49 has been depressed. As shown in FIG. 5, the keys 38-49 are arranged in an array comprising four vertical columns and three horizontal rows. Each of the keys 38-49 supplies a switch connection between one of the scanning lines 91-94 and one of three row-sensing lines 97-99 which are connected to the microcomputer 72. As each of the scanning lines 91-94 is activated sequentially, it activates one of the four columns of keys 38-49. If one of the keys in an activated column has been depressed, a signal is supplied to the appropriate sensing line 97, 98 or 99 and sensed by the microcomputer 72. The result of the keyboard scanning indicating which of the keys 38-49 is depressed is then stored by the microcomputer 72 in a location in its random access memory. The main control program of the microcomputer 72 subsequently fetches this keyboard input and closes the appropriate switches 55-60 by means of the control lines 73-78 to provide the desired analog voltage output from the buffer amplifier 62 (FIG. 4).

The output display is performed simultaneously with the keyboard scanning. Thus, when the scanning line 91 is activated and the leftmost digit is being output to the display element 84, the leftmost column of keys 38, 41 and 44 is being scanned. Then the scanning line 92 is activated with the output of a digit to the display element 85 and the scanning of the second column of keys 39, 42, and 45. The scanning lines 93 and 94 are then sequentially activated to complete the process.

If the desired power function requires either peak envelope power or valley envelope power data, the voltage corresponding to these power readings is supplied from either the peak detector 65 or the valley detector 66 (FIG. 3). The peak detector 65 comprises an operational amplifier 101 having its output fed through a forward diode 102 biased by a biasing resistor 103 connected to the negative voltage source. Prior to actuation of the peak detector, the output is zero as the negative power source connected to the resistor 103 pulls a capacitor 104 to ground. As the voltage corresponding to the carrier wave power is fed to the input of the amplifier 101 of the peak detector 65, the output is pulled up to the peak value. As the input voltage drops off, the peak value is held by the capacitor 104 and the diode 102. This peak voltage is then supplied to the switch 58. The valley detector 66 is essentially the reverse of the peak detector 65 and comprises an operational amplifier 105 with the output fed to a reverse diode 106 which is biased by a resistor 107 connected to the positive voltage source. A capacitor 108 is initially pulled up to the ground by the positive voltage source connected to the resistor 107. As the carrier wave voltage reading is supplied to the amplifier 105 of the valley detector 66, the diode 106 and the capacitor 108 serve to hold the lowest positive voltage reading and supply this valley voltage to the switch 59.

As shown in FIG. 4, the selected analog voltage level is output from the buffer amplifier 62, and it is converted to digital form by means of an integrator and comparator unit 110 under the control of a portion of the microcomputer 72. The microcomputer 72 performs a dual-ramp analog-to-digital (A-D) conversion using the unit 110. The integrator and comparator unit 110 may be a standard MC1405L unit, and comprises an integrator having the output connected to a comparator. The microcomputer 72 controls the unit 110 by means of a control line 111 which is connected to the integrator through an inverter 112. The output of the inverter 112 is connected to the ramp control input of the unit 110 by line 113. The output of the comparator of the unit 110 is supplied on a line 114 to a latch comprising a pair of NAND gates 115 and 116. The output of the latch is then fed to the microcomputer 72 on line 117. Using the dual ramp method of A-D conversion, the integrator and comparator unit 110 is set and a counter within the microcomputer 72 determines the number of time counts required for the integrator in the unit 110 to reach the desired voltage. When the desired voltage is reached, this is sensed by the comparator in the unit 110. This counter then reflects a digital representation of the analog value of the voltage supplied to the unit 110. The digital reading from the counter is then used by the microcomputer 72 in its arithmetic calculations performed in accordance with the control program. The latch comprising the NAND gates 115 and 116 serves to prevent noise on the comparator output line 114 from the unit 110 from inadvertently triggering the digital counter in the microcomputer 72 which records the result of the A-D conversion, so that the counter does not record an erroneous value. The control line 113 from the inverter 112 is also used in the latch as one of the inputs to the NAND gate 116 to prevent the voltage on the line 117 which corresponds to the comparator output from going to low level and triggering the digital counter in the microcomputer 72 except during the integrator timing period when the voltage on the line 113 is high level (and thus the control signal from the microcomputer on line 111 is now level).

The control program in the microprocessor comprises a main program and two priority interrupt subprograms. These programs are depicted in the flow charts of FIGS. 6-9.

Figure 6:
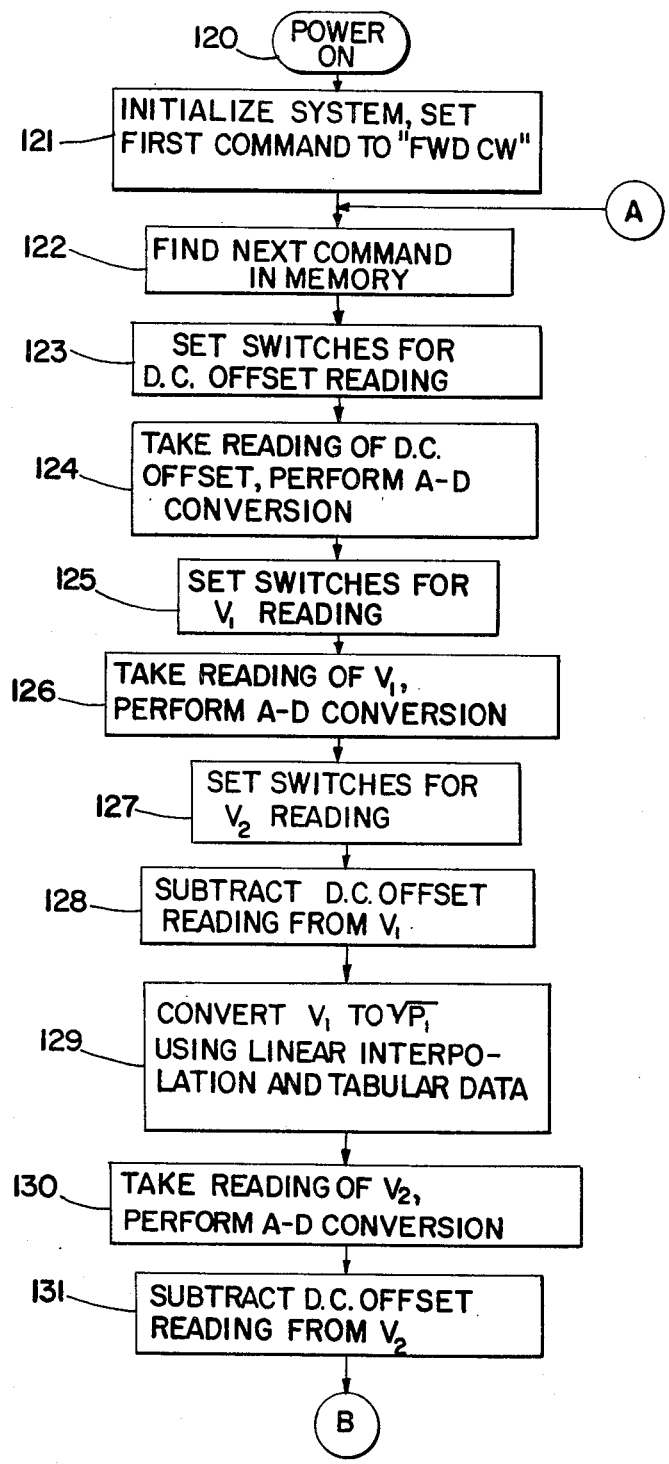
FIGS. 6 and 7 are flow charts showing the steps of the main program stored in the microcomputer which operates the instrument of the present invention.
Figure 7:
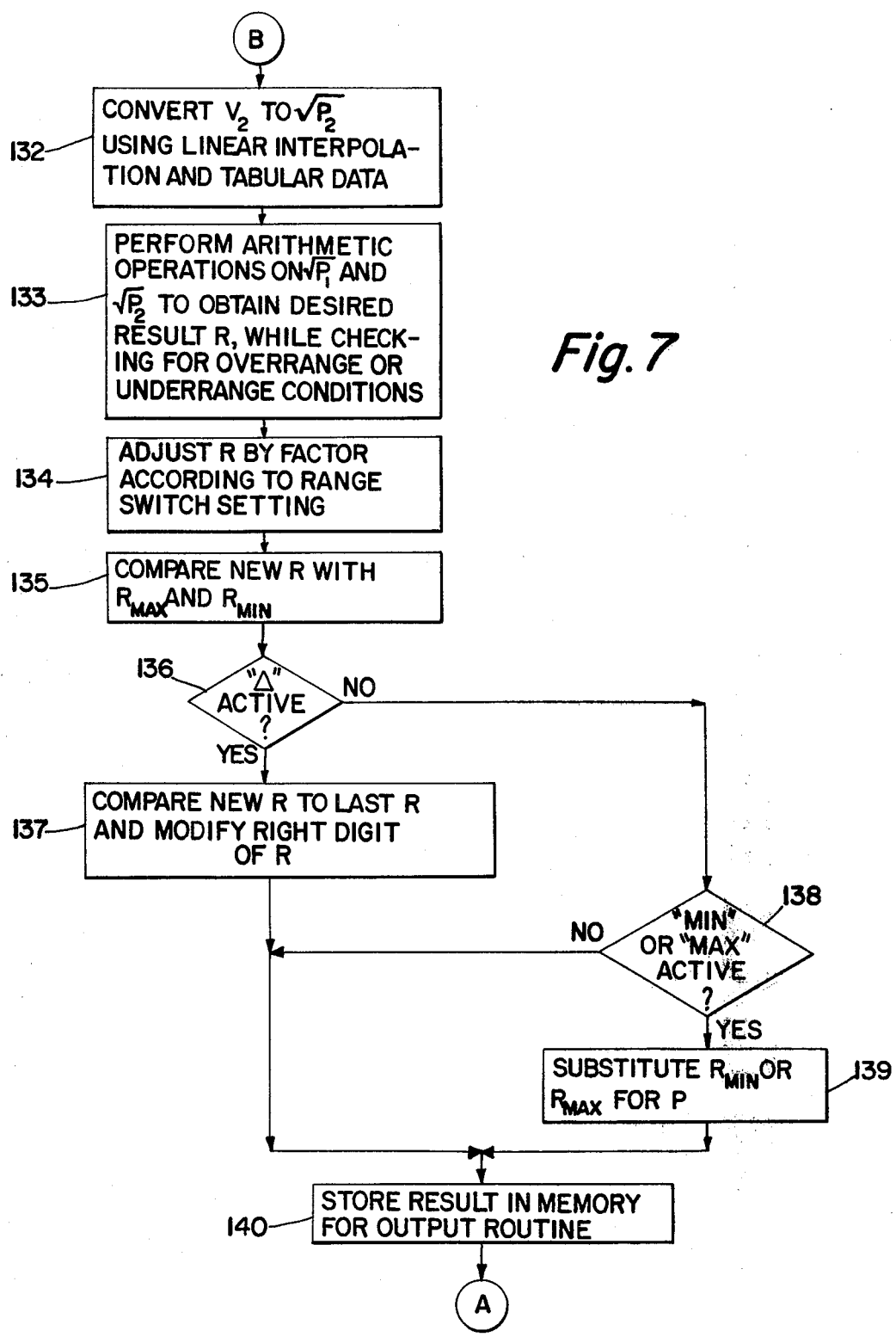

The main program is shown in FIGS. 6 and 7. With reference to FIG. 6, the main program begins at step 120 when power to the instrument is turned on by the switch 32 (FIG. 1). Thereafter, in step 121 (FIG. 6), the parameters of the program are initially set and the program presumes that the initial input command is FWD CW. Next, in step 122 the program finds the actual input command from the location in memory where the input command is stored by the digit strobe interrupt subprogram, as hereafter described with reference to FIG. 9. In steps 123 and 124 (FIG. 6), the program takes a DC offset reading. This DC offset reading is accomplished by, first in step 123, closing only switch 60 while leaving all of the other switches 55, 56, 57, 58, and 59 open (FIG. 2). The microcomputer then, in step 124 (FIG. 6), measures the direct current offset of the analog circuitry. In subsequent steps, this DC offset reading is used to correct the two measured voltage readings $V_1$ and $V_2$. The identity of the first and second measured voltage readings and the corresponding settings in the switches 55–60 used to obtain these readings depends upon the input command from the keyboard 30, as shown in tabular form in FIG. 11. For each of the nine selected power functions, the program obtains first and second voltage readings with the appropriate switches 55–60 closed. These voltages readings are then stored in a location in the microcomputer's random access memory.

As shown in FIG. 11, for the forward carrier wave power, the program measures the forward peak envelope voltage ($V_{FPE}$) and the forward valley envelope voltage ($V_{FVE}$). The forward peak envelope voltage is measured by closing switches 55, 57, and 58 while opening switches 56, 59, and 60. The forward valley envelope voltage is measured by closing switch 55, 57, and 59 while opening switches 56, 58, and 60. To obtain the reflected carrier wave power, the program measures the reflected peak envelope voltage ($V_{RPE}$) and the reflected valley envelope voltage ($V_{RVE}$). These voltages are measured similarly to the forward voltages, except that switch 56 is closed and switch 55 is open. To obtain the voltage standing wave ratio (VSWR), the program utilizes a forward direct current voltage ($V_{FDC}$) reading and a reflected direct-current voltage ($V_{RDC}$) reading. The forward DC voltage reading is obtained by closing switches 55 and 60 and opening all of the other switches. The reflected DC voltage reading is obtained by closing switch 56, as well as switch 60, and leaving the other switches open. The forward peak envelope power is obtained from two readings of the forward peak envelope voltage, while the reflected peak envelope power uses two readings of the reflected peak envelope voltage. The present modulation function is obtained from a forward peak envelope voltage reading and a forward valley envelope voltage reading. The forward decibels are obtained from a forward peak envelope voltage reading and a forward valley envelope voltage reading, while the reflected decibels are obtained from a reflected peak envelope voltage reading and a reflected valley envelope reading. Finally, the return loss is obtained from a forward direct current voltage reading and a reflected direct current voltage reading.

Returning to FIG. 6, the program in step 125 opens and closes the appropriate analog switches 55–60 in order to take the first voltage ($V_1$) reading. This reading is taken in step 126 and converted from analog-to-digital form. In step 127, the program sets the switches 55–60 in preparation for obtaining the second voltage ($V_2$) reading. While the $V_2$ reading is being sensed, the DC offset reading obtained in step 124 is subtracted in step 128 from the measured $V_1$ value in order to obtain a true voltage reading and to compensate for the DC offset drift of the analog circuitry. In step 129, the corrected $V_1$ reading is converted to a value representing the corresponding square root of power ($\sqrt{P_1}$). This conversion is accomplished within the program by a linear interpolation of a tabular data representing a correspondence between V and $\sqrt{P}$. By using a linear interpolation method to arrive at $\sqrt{P}$ values, the program gives better linearity than would be obtained if P were interpolated directly from V, since V has a more linear relationship with $\sqrt{P}$ than to P itself.

The program then repeats the operations of steps 126, 128, and 129 for $V_2$. In step 130, the second voltage ($V_2$) reading is taken based upon the switch settings made in step 127, and the reading is converted to digital form. In step 131, the DC offset reading obtained in step 124 is subtracted from the measured $V_2$ reading. The program continues through point B to step 132 (FIG. 7) in which the corrected $V_2$ reading is converted to $\sqrt{P_2}$ using the liner interpolation method and the tabular data.

In step 133, the $\sqrt{P_1}$ and $\sqrt{P_2}$ values are used in various arithmetic operations to obtain the value of the desired power function. The arithmetic operations which are performed on $\sqrt{P_1}$ and $\sqrt{P_2}$ are shown in tabular form in FIG. 12. To obtain the forward carrier wave power (FWD CW), the square root of the forward peak envelope power ($\sqrt{P_{FPE}}$) is summed with the square root forward valley envelope power ($\sqrt{P_{PVE}}$) and the sum is divided by two and squared to arrive at the forward carrier wave power. By using both the peak and valley power readings to calculate the forward carrier wave power value, the threshold of the diode 102 or 106 in the detector does not cause error as it does if the detector output is DC averaged to arrive at CW power. This advantage occurs because the diode threshold is taken into accont in the tables used for the linear interpolation of V to P before the values are averaged. A similar computation method is used for the reflected CW power (RFL CW).

The voltage standing wave ratio (VSWR) is calculated from the sum of the square root of forward and reflected DC power divided by the difference between th square root of the forward and reflected DC power. The forward peak envelope power is calculated from two successive readings of the square root of peak envelope power ($\sqrt{P_{FPE}}$), summed and divided by two and thereafter squared. This calculation method utilizes the two $V_{VPE}$ voltage readings obtained by the program in steps 126 and 130 to decrease possible error in either of the $V_{VPE}$ readings. A similar method is used to calculate the reflected peak envelope power ($P_{RPE}$). To obtain the percent modulation, the difference between the square root of forward peak envelope power and square root of forward valley envelope power is divided by the difference of these two values and the result multiplied by 100 to obtain a percentage value.

The remaining three functions each use logarithmic values. Forward decibels (dBm) are obtained by adding the square root of the forward peak envelope power to the square root of the forward valley envelope power, dividing by two and squaring the results, and thereafter obtaining the logarithmic value of this result multiplied by ten. A similar calculation is used to obtain reflected decibels. The return loss is calculated by dividing the square root of the forward DC power by the square root of the reflected DC power, squaring the result, obtaining the logarithmic value of this result, multiplied by ten. The logarithmic values are obtained using a series approximation by performing a number of multiplications on the result.

While performing the arithmetic operations, the program checks for the appropriate overrange and underrange limits. For example, if the value of the forward carrier wave power exceeds 120% of the range of the forward measuring element 35, the program replaces the value with an overrange indication, so that only an overrange indication is displayed. If the calculated voltage standing wave ratio is less than 1.00, the value is set to 1.00.

After the desired arithmetic operations have been performed in step 133 (FIG. 7), the result is corrected in step 134 by an appropriate factor according to the setting of the range switches 31. If necessary, the program then proceeds to step 135, where the result is compared with the maximum and minimum values obtained since the last primary function command was input.

In step 136, the program determines whether the "delta" function is active. If so, it proceeds to step 137 in which the new result is compared with the last value obtained. The right-most decimal digit of the output for display is then replaced by a less-than symbol, a blank, or a greater-than symbol, depending upon the outcome of a comparison of the current result with the last result. If the "delta" function is not active, the program skips step 137 and proceeds to step 138 in which it determines if either MAX or MIN function is active. If the MAX or MIN keys have been pressed, the program in step 139 substitutes the appropriate updated minimum or maximum value for use as the displayed output. If the MAX or MIN function is not active, or if the "delta" function is active, the program skips step 139.

Finally, in step 140, the result which is intended to be outputted for display is stored in a location in the random access memory of the microcomputer for eventual output by the output subroutine. The program then proceeds back through point A to step 122 (FIG. 6) in order to obtain the next input command and proceed with the next voltage readings and power function calculations.

Figure 8:
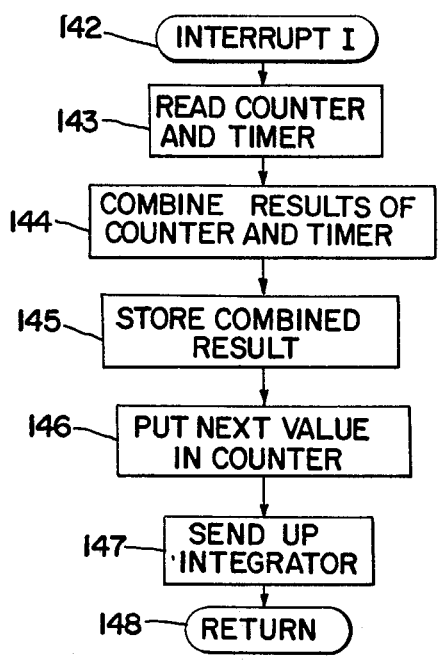
FIGS. 8 and 9 are flow charts of priority interrupt subprograms which are also stored in the microcomputer and provide operations in addition to the main program.
Figure 9:
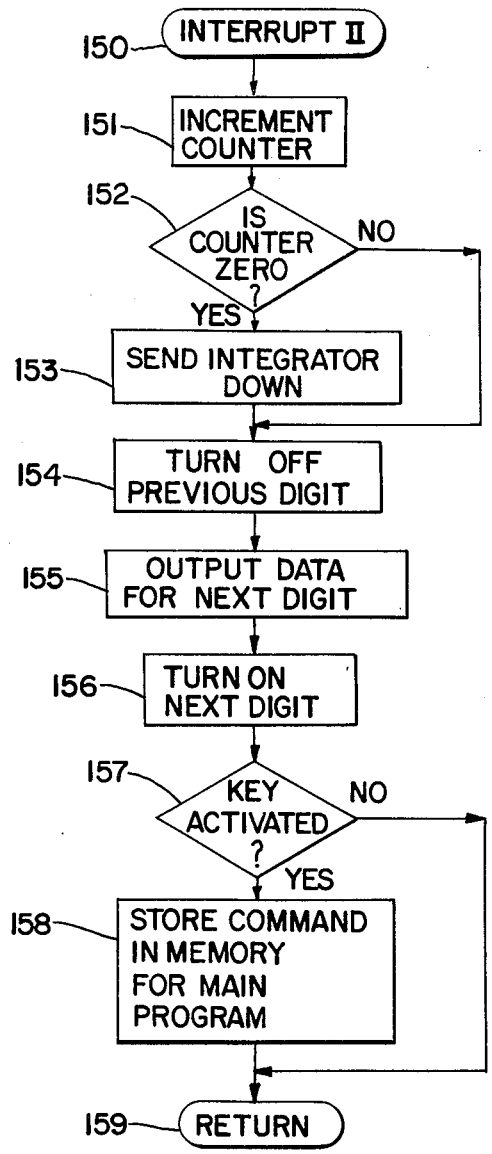

In addition to the main program illustrated in FIG. 5, the microcomputer contains two priority interrupt subprograms illustrated by the flow charts of FIGS. 8 and 9. These two priority interrupt subprograms are used to control the analog-to-digital (A-D) conversion. As previously described, an analog voltage level is output from the buffer amplifier 62 to the integrator and comparator unit 110 (FIG. 4). The dual-ramp A-D conversion performed by the unit 110 is controlled by the microcomputer 72 through line 111 in accordance with the two priority interrupt subprograms of FIGS. 8 and 9. The voltage output of the integrator in the unit 110 as supplied to the comparator in the unit shown in FIG. 10 along with the comparator output as sent from the unit 110 on line 114, the ramp control input as received by the unit 110 on line 113, and the value in the A-D counter register in the microcomputer 72.

Figure 10:
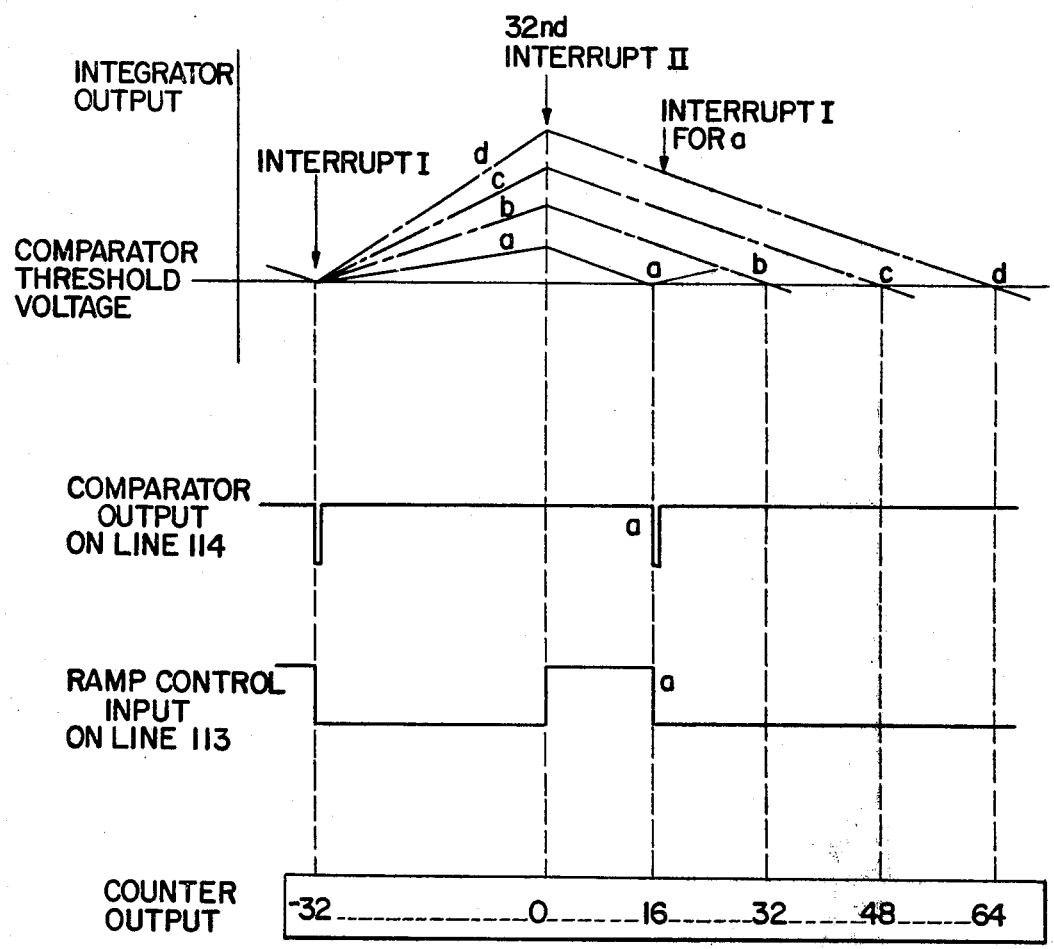
FIG. 10 is a chart showing the voltage output level in its conversion from analog form to digital form.

Initially, the first subprogram of FIG. 8 begins at step 142 when the interrupt I signal is triggered. The interrupt I signal is triggered when the integrator output crosses the threshold voltage of the comparator (FIG. 10). This is sensed by the comparator, which supplies a low-level output on the line 114 (FIG. 4) to the microcomputer 72. The subprogram proceeds to steps 143, 144, and 145 (FIG. 8) in which the values in the counter and a separate timer are read and summed and the results stored in a location in the random access memory of the microcomputer. In step 146, the counter is set to a value of −32, and in step 147 the integrator is sent up by placing a high-level signal on line 111 (FIG. 4). This signal is sent through the inverter 112 and received by the integrator 120 as a low-level ramp control signal on line 113. The low level on line 113 is also input to the NAND gate 116 blocking the integrator output voltage from reaching the microcomputer 72, so that the level on line 117 remains high. The program control then returns in step 148 (FIG. 8) to its previous position in the main program or in the lower priority interrupt subprogram in which the program control was set at the time the interrupt I signal was initiated.

The second interrupt subprogram, which is depicted in FIG. 9, performs the second step in the analog-to-digital conversion and is also used to output the result obtained by the main program and to scan the keyboard to obtain the input command indicating the next function to be calculated. The program is initiated at step 150 by an interrupt II signal which is triggered by overflow of a timer every 1024 microseconds. In the next step 151, the program increments the counter which had been initially set to −32 by the first interrupt subprogram in step 146. The program then tests in step 152 to determine if the counter has reached zero. The counter will be zeroed following the 32nd interrupt II signal after an interrupt I signal, and this will occur approximately 32 milliseconds (32×1024 microseconds) after the integrator in the unit 110 has been sent up. At this point, the integrator output voltage is at a value corresponding to the input voltage to the integrator. Four representative integrator output voltages are shown by the lines a, b, c, and d in FIG. 10. If the counter is zero, the program proceeds to step 153 in which the integrator is sent back down by placing a low-level signal on line 111 (FIG. 4). This signal is inverted to a high-level signal on line 113 which is received by the ramp control input of the unit 110 (FIG. 10) and by the NAND gate 116. The gate 116 thus becomes operative so that when a zero-level signal is sent from the comparator output on line 114, it will be sent as a low-level signal on line 117. The program then proceeds with the output display and keyboard scan steps 154–159 (FIG. 9), which will be discussed more fully hereinafter. The integrator voltage output is allowed to decrease at a constant rate until it reaches zero while the counter increases from zero by being incremented every 1024 microseconds (FIG. 10). The point at which the integrator output reaches zero is dependent upon the voltage level of the integrator output at the time of step 153 in which the integrator is sent down. Four possible zero points for the lines a, b, c, and d are shown in FIG. 10. When the integrator output reaches zero, the zero voltage level is supplied from the integrator to the comparator within the unit 110. This causes the comparator output on line 114 to drop to low level (FIG. 10). The low level signal is sensed by the microcomputer on line 117 (FIG. 4) and an interrupt I signal is initiated, returning the program control to the first interrupt subprogram at step 142 (FIG. 8). In step 143, the program determines the values in the counter and the timer which together correspond to a digital representation of the voltage received by the integrator, and these values are combined in step 144, and the result is stored in step 145 at a location in the microcomputer random access memory for subsequent retrieval by the main program in step 124 or 126 (FIG. 6). In steps 146 and 147 (FIG. 8) a new value of −32 is put into the counter and the integrator is sent back up by sending a low-level ramp control input on line 113 (FIG. 10). The first interrupt subprogram step 148 (FIG. 8) then returns the program control to its previous position.

When power is turned on to the instrument, A-D conversion counter is set to zero, so that when the interrupt II signal is initiated by the timer, the second interrupt subprogram will not send the integrator down. The integrator is then sent down in step 124 of the main program (FIG. 6). When the integrator output reaches the comparator threshold voltage, the interrupt I signal is triggered and the first interrupt subprogram is performed, sending the integrator back up at step 148

(FIG. 8). Thereafter, the integrator output cycles up and down, performing A-D conversions simultaneously with the operation of the main program in a time-sharing basis. The A-D conversions are thus performed for the DC offset voltage reading of step 124 of the main program (FIG. 6) and for the $V_1$ reading of step 126 and the $V_2$ reading of step 130. It should be noted that the switches are set for the $V_2$ reading in step 127 before the conversion of the $V_1$ reading to $\sqrt{P}$, in step 129, so that the A-D conversion for $V_2$ can be initiated while steps 128 and 129 are being performed in the main program.

The second interrupt subprogram of FIG. 9 is also used to output the result obtained by the main program and to scan the keyboard to obtain the input command indicating the next power function to be calculated. The program is initiated at step 150 by the interrupt II signal which is triggered by the timer every 1024 microseconds so that a portion of the keyboard is scanned every 1024 micoseconds. After incrementing the counter in step 151 and testing to determine if the counter is at zero in step 152, and sending the integrator down if necessary in step 153, the program proceeds to output one of the digits of the calculated result to one of the display elements 84-87 (FIG. 5). The program reads the calculated result placed in the microcomputer random access memory by step 140 of the main program (FIG. 7). This result is fetched from memory and output to the display by the second interrupt subprogram (FIG. 9). The result is broken down to its component BCD digits and one of the digits is output by the second interrupt subprogram each time the program is performed. In step 154, the scanning line 91-94 (FIG. 5) used to output the last digit is turned off. For example, if the last digit output was the leftmost digit to the display element 84, the scanning line 91 which was used for this digit is turned off in step 154. In step 155 (FIG. 9), the next BCD digit is sent to the BCD-to-seven-segment decoder/driver 82 (FIG. 5), where it is converted to seven-segment form and fed to the display elements 84-87. In step 156 (FIG. 9), the subprogram activates the next scanning line 91-94 (FIG. 5) to activate the appropriate display element 84-87. One column of keys on the keyboard 30 is also activated by one of the scanning lines 91-94. If one of the keys in the activated column has been depressed, the appropriate return signal will be sent back to the microcomputer 72 on one of the row sensing lines 97-99. Which one of the lines 97-99 will be activated depends upon the row in which the activated key is. For example, if a digit is to be output to the display element 85, this digit is placed on the lines 81 and the scanning line 92 is activated. At the same time, the column of the keyboard 30 containing the keys 39, 42 and 45 is activated. If the key 39 has been depressed, this is sensed by the microcomputer 72 at this time by the activation of the sensing line 97. The program then determines in step 157 (FIG. 9) whether a new command has been input through the keyboard 30. If so, the program proceeds to 158, and stores this command at a location in random access memory for subsequent fetching by the main program in step 122 (FIG. 6). If no new command has been entered, the program skips step 158 (FIG. 9). The program then encounters step 159, where it returns to the main program at the point at which the main program was originally interrupted by the interrupt II signal.

It is also possible to include additional power or voltage functions with the instrument of the present invention. An additional row of keys may be added to the keyboard below the keys 44, 45, 46, and 49 (FIG. 5) and a fourth sensing line added to the lines 97, 98, and 99 to accommodate the keys. The main program could then be modified to incorporate the various voltage readings and calculations needed for the additional functions.

While the invention has been shown and described with respect to a specific embodiment thereof, it is intended for the purpose of illustration rather than limitation, and other modifications and variations in the specific form herein shown and described will be apparent to those skilled in the art, all within the intended spirit and scope of the invention. Accordingly, the patent is not to be limited in scope and effect to the specific embodiment herein shown and described, nor in any other way that is inconsistent with the extent to which the progress within the art has been advanced by the invention.

What is claimed is:

1. An electronic instrument for measuring directional RF power levels and power function levels on a coaxial transmission line, said instrument adapted to be inserted in the line, the instrument comprising:

an inductive sensing loop for sensing the RF voltage level on the transmission line and producing a voltage level proportional thereto;

means connected to the sensing loop for detecting the peak envelope voltage wave level on the transmission line;

means connected to the sensing loop for detecting the valley envelope voltage wave level on the transmission line;

an analog-to-digital conversion means connected to the sensing loop and the peak envelope detecting means and the valley envelope detecting means for converting the voltage levels from the sensing loop and from the peak envelope detecting means and from the valley envelope detecting means to binary voltage data;

microcomputer means associated with the conversion means for performing arithmetic operations upon the binary voltage data to calculate power data and power function data, the microcomputer means including means for calculating the carrier wave power from both the peak envelope voltage data and the valley envelope voltage data; and means connected to the microcomputer means for displaying the power date and the power function data calculated by the microcomputer means.

2. An instrument as defined in claim 1, comprising in addition a second inductive sensing loop for sensing the RF voltage in the order direction in the transmission line and producing a second voltage level proportional thereto.

3. An instrument as defined in claim 2, wherein the microcomputer means includes means for selecting the operability of one of the conductive sensing loops.

4. An instrument as defined in claim 2, wherein the microcomputer means includes means for calculating the voltage standing wave ratio from voltage data received from the sensing loops.

5. An instrument as defined in claim 2, wherein the microcomputer means includes means for calculating the return loss from voltage data received from the sensing loops.

6. An instrument as defined in claim 1, wherein the microcomputer means includes means for selecting one of the voltage levels from the sensing loop and the peak envelope detecting means and the valley envelope detecting means for conversion by the conversion means.

7. An instrument as defined in claim 1, wherein the microcomputer means includes means for calculating the percent modulation from the voltage data received from the peak envelope detecting means and the valley envelope detecting means.

8. An instrument as defined in claim 1, wherein the microcomputer means includes means for calculating decibels from the voltage data received from the peak envelope detecting means and the valley envelope detecting means.

9. An instrument as defined in claim 1, wherein the microcomputer means includes means for converting the binary voltage data to binary data representing the square root of power.

10. An instrument as defined in claim 1, comprising in addition input means connected to the microcomputer means for selecting which of the power data and power function data is to be calculated by the microcomputer means.

11. An instrument as defined in claim 1, wherein the microcomputer means includes means for comparing the calculated value for the power data and power function data with a previously calculated data value to obtain a parameter representing a change in the calculated value over the previous value.

12. An instrument as defined in claim 1, wherein the microcomputer means includes means for comparing each calculated value of the power data and power function data with the maximum previously calculated value to obtain a new maximum value.

13. An instrument as defined in claim 1, wherein the microcomputer means includes means for comparing values of the power data and power function data with overrange values to test for erroneous data.

14. An electronic instrument for measuring RF power levels and power function levels on a coaxial transmission line, said instrument adapted to be inserted in the line, the instrument comprising:
a first inductive sensing loop for sensing the RF voltage level in one direction on the transmission line;
a second inductive sensing loop sensing the RF voltage level in the opposite direction on the transmission line;
means selectively connected to one of the sensing loops for detecting the peak envelope voltage wave level on the transmission line;
means selectively connected to one of the sensing loops for detecting the valley envelope voltage wave level on the transmission line;
analog-to-digital conversion means selectively connected to one of the sensing loops and the peak envelope detecting means and the valley envelope detecting means for converting the voltage levels from the sensing loops and from the peak envelope detecting means and from the valley envelope detecting means to digital data corresponding to the voltage levels;
microcomputer means associated with the conversion means, said microcomputer means including means for selecting one of the first and second inductive sensing loops for connection to the peak envelope detecting means and the valley envelope detecting means, means for selecting one of the voltage levels from the sensing loops and the peak envelope detecting means and the valley envelope detecting means for conversion by the analog-to-digital conversion means, and means for performing arithmetic operations upon the digital data from the conversion means to calculate power data and power function data including means for calculating the carrier wave power from both the peak envelope voltage data and the valley envelope voltage data;
input means connected to the microcomputer means for selecting which of the power data and power function data is to be calculated by the microcomputer means; and
means connected to said microcomputer means for displaying the power data and power function data calculated by the microcomputer means.

15. An instrument as defined in claim 14, wherein the microcomputer means includes means for caulating the voltage standing wave ratio from voltage data received from the sensing loops.

16. An instrument as defined in claim 14, wherein the microcomputer means includes means for calculating the return loss from voltage data received from the sensing loops.

17. An instrument as defined in claim 14, wherein the microcomputer means includes means for calculating the percent modulation from the voltage data received from the peak envelope detecting means and the valley envelope detecting means.

18. An instrument as defined in claim 14, wherein the microcomputer means includes means for calculating decibels from the voltage data received from the peak envelope detecting means and the valley envelope detecting means.

19. An instrument as defined in claim 14, wherein the microcomputer means includes means for converting the binary voltage data to binary data representing the square root of power.

20. An instrument as defined in claim 14, wherein the microcomputer means includes means for comparing the calculated value for the power data and power function data with a previously calculated data value to obtain a parameter representing a change in the calculated value over the previous value.

21. An instrument as defined in claim 14, wherein the microcomputer means includes means for comparing each calculated value of the power data and power function data with the maximum previously calculated value to obtain a new maximum value.

22. An instrument as defined in claim 14, wherein the microcomputer means includes means for comparing values of the power data and power function data with overrange values to test for erroneous data.

* * * * *